United States Patent
Moore et al.

(10) Patent No.: US 11,437,989 B2
(45) Date of Patent: Sep. 6, 2022

(54) INSULATED GATE POWER DEVICE WITH INDEPENDENTLY CONTROLLED SEGMENTS

(71) Applicant: Pakal Technologies, Inc., San Francisco, CA (US)

(72) Inventors: Paul M. Moore, Fremont, CA (US); Richard A. Blanchard, Los Altos, CA (US); Vladimir Rodov, Seattle, WA (US); Gary M. Hurtz, San Francisco, CA (US)

(73) Assignee: PAKAL TECHNOLOGIES, INC, San Francisco, CA (US)

( * ) Notice: Subject to any disclaimer, the term of this patent is extended or adjusted under 35 U.S.C. 154(b) by 0 days.

(21) Appl. No.: 17/388,683

(22) Filed: Jul. 29, 2021

(65) Prior Publication Data
US 2022/0045674 A1    Feb. 10, 2022

Related U.S. Application Data (60) Provisional application No. 63/060,984, filed on Aug. 4, 2020.

(51) Int. Cl.
| | |
|---|---|
| *H03K 3/00* | (2006.01) |
| *H03K 5/08* | (2006.01) |
| *H03K 17/567* | (2006.01) |
| *H02M 3/07* | (2006.01) |
| *H03K 17/16* | (2006.01) |
| *H01L 29/06* | (2006.01) |

(52) U.S. Cl.
CPC ......... *H03K 17/162* (2013.01); *H03K 17/168* (2013.01); *H01L 29/0696* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 4,977,333 A | * | 12/1990 | Suzuki | H03K 17/12 377/2 |
| 6,894,465 B2 | * | 5/2005 | Sutardja | H02M 3/157 323/268 |
| 7,847,530 B2 | * | 12/2010 | Takagi | G05F 1/56 323/280 |

(Continued)

*Primary Examiner* — Kenneth B Wells
(74) *Attorney, Agent, or Firm* — Patent Law Group; Brian Ogonowsky (57) ABSTRACT

A design technique is disclosed that divides up a cellular power switch into different size segments. Each segment is driven by a different driver circuit. The selection of the combination of segments is made to minimize the combined conduction and switching losses of the power switch. For example, for very light loads, switching losses dominate so only a small segment is activated for driving the load. For medium and high load currents, conduction losses become more significant, so additional segments are activated to minimize the total losses. In one embodiment, the number of cells in the segments is binary weighted, such as 1×, 2×, and 4×, so that there are seven different combinations of segments. The drivers may be configured to achieve the same or different slew rates of the segments, such as to reduce transients. The segments may all be in the same die or a plurality of dies.

15 Claims, 5 Drawing Sheets

(56) References Cited

U.S. PATENT DOCUMENTS

| | | | |
|---|---|---|---|
| 9,509,284 B2* | 11/2016 | Haeberlen | H03K 17/122 |
| 2008/0024012 A1* | 1/2008 | Qahouq | H03K 17/167 |
| | | | 307/126 |
| 2017/0179946 A1* | 6/2017 | Turvey | H03K 17/163 |

* cited by examiner

INSULATED GATE POWER DEVICE WITH INDEPENDENTLY CONTROLLED SEGMENTS

CROSS-REFERENCE TO RELATED APPLICATIONS

This application is based on provisional application Ser. No. 63/060,984, filed Aug. 4, 2020, by Paul M. Moore et al., assigned to the present assignee and incorporated herein by reference.

FIELD OF THE INVENTION

This invention relates to insulated-gate power devices, such as MOSFETs, insulated gate bipolar transistors (IGBTs), gate-controlled thyristors, insulated-gate turn off (IGTO) devices, and other types of MOS-gated semiconductor switches that are generally used with high current/high voltage loads and, in particular, to a design that reduces losses from both switching and conduction.

BACKGROUND

Applicant's U.S. Pat. No. 8,878,238, incorporated by reference, discloses a vertical power device which will be used as an example of one of many types of insulated-gate power devices that can benefit from the present invention. An insulated-gate power device from U.S. Pat. No. 8,878,238 will be described in detail, and the invention will later be described as a modification to such a device, and other insulated-gate power devices, rather than repeating a detailed description of the prior art portion of the inventive structure.

Figure 1:
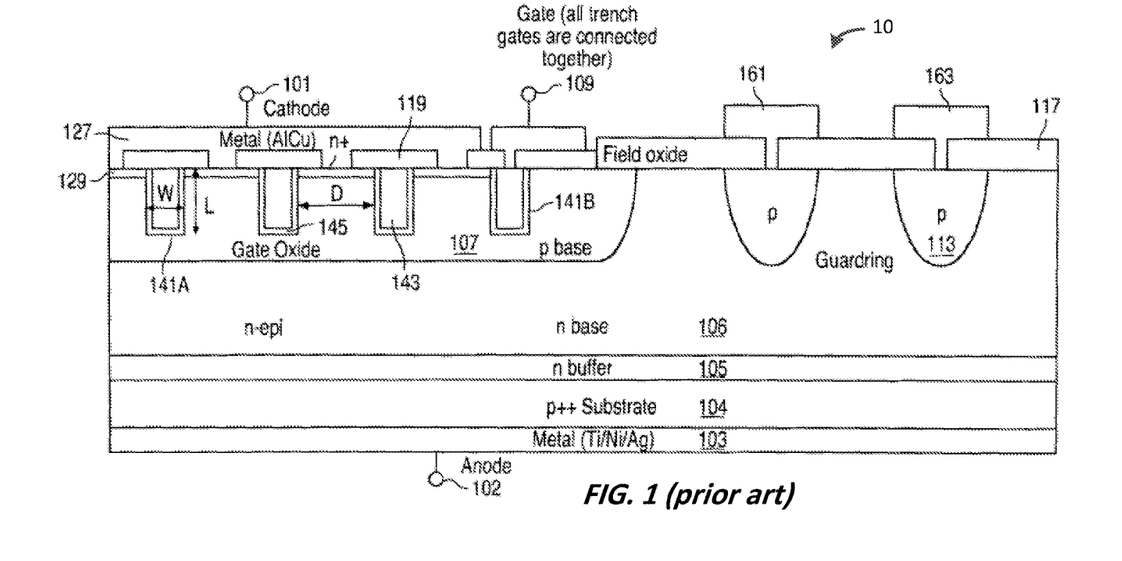
FIG. 1 is copied from Applicant's U.S. Pat. No. 8,878,238 and is a cross-section of a vertical switch having insulated trench gates connected in parallel.

Prior art FIG. 1 is a cross-sectional view of a small portion of a vertical power device 10 described in U.S. Pat. No. 8,878,238 that can benefit from the present invention. Although FIG. 1 just shows an edge portion of the cellular power device 10, the invention applies to all areas within the cellular array.

Three cells are shown having vertical gates 143 (e.g., doped polysilicon) formed in insulated trenches 141A. Trench 141B is for a polysilicon connection to all the gates 143 and may not be considered a cell. A 2-dimensional array of the cells forming, for example, strips or a rectangular mesh, may be formed in a common, lightly-doped p-well 107 (acting as a p-base), and the cells are connected in parallel.

N+ regions 129 surround some or all of the gates 143 and are contacted by a top, metal cathode electrode 127 having a cathode terminal 101. The n+ regions 129 may be formed by implantation or by other known dopant introduction methods.

The vertical gates 143 are insulated from the p-well 107 by an oxide layer 145. The gates 143 are connected together outside the plane of the drawing and are coupled to a gate voltage via a metal gate electrode 109 directly contacting the polysilicon in the trench 141B. A patterned dielectric layer 119 insulates the gate electrode 109 from the p-well 107 and insulates the gates 143 from the cathode electrode 127.

Guard rings 113 near the edge of the die reduce field crowding for increasing the breakdown voltage. The guard rings 113 are contacted by metal 161 and 163, which are insulated from the n− drift layer 106 by field oxide 117.

A vertical npnp semiconductor layered structure is formed. There is a bipolar pnp transistor formed by a p+ substrate 104, an epitaxially grown n− drift layer 106 (acting as an n-base), and the p− well 107. There is also a bipolar npn transistor formed by the n+ regions 129, the p-well 107, and the n− drift layer 106. An n-type buffer layer 105, with a dopant concentration higher than that of the n− drift layer 106, reduces the injection of holes into the n-drift layer 106 from the p+ substrate 104 when the device is conducting. It also reduces the electric field at the anode pn-junction when the power device 10 is reverse biased. A bottom anode electrode 103 contacts the substrate 104, and the top cathode electrode 127 contacts the n+ regions 129 and also contacts the p-well 107 at selected locations. The p-well 107 surrounds the gate structure, and the n− drift layer 106 extends to the surface around the p-well 107.

When the anode electrode 103 is forward biased with respect to the cathode electrode 127, but without a sufficiently positive gate bias, there is no current flow, since there is a reverse biased vertical pn junction and the product of the betas (gains) of the pnp and npn transistors is less than one (i.e., there is no regeneration activity).

When the gate 143 is sufficiently biased with a positive voltage (relative to the n+ regions 129), such as 2-5 volts, an inversion layer is formed around the gate 143, and electrons from the n+ regions 129 become the majority carriers along the gate sidewalls and below the bottom of the trenches in the inversion layer, causing the effective width of the npn base (the portion of the p-well 107 between the n-layers) to be reduced. As a result, the beta of the npn transistor increases to cause the product of the betas to exceed one. This condition results in "breakover," when holes are injected into the lightly doped n− drift layer 106 and electrons are injected into the p-well 107 to fully turn on the device. Accordingly, the gate bias initiates the turn-on, and the full turn-on (due to regenerative action) occurs when there is current flow through the npn transistor as well as current flow through the pnp transistor.

When the gate bias is taken to zero, such as the gate electrode 109 being shorted to the cathode electrode 127, or taken negative, the device 10 turns off, since the effective base width of the npn transistor is increased to its original value.

The device 10 is intended to be used as a high voltage/high current switch with very low voltage drop when on. The maximum voltage for proper operation is specified in a data sheet for the device 10.

The device 10 is similar to many other types of high current/high voltage insulated-gate power devices in that it is cellular and all the gates are connected together to a single driver.

Figure 2:
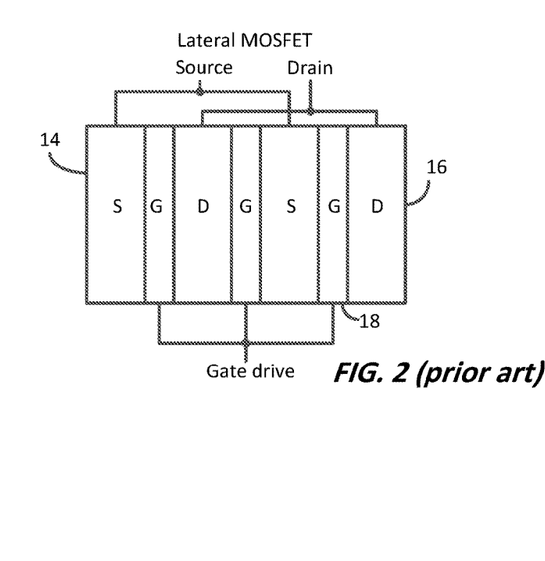
FIG. 2 represents a conventional lateral MOSFET having cells.
Figure 3:
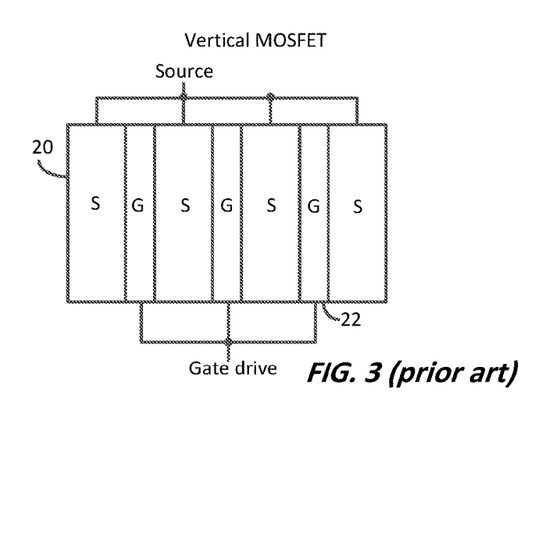
FIG. 3 represents a conventional vertical MOSFET having cells.

FIGS. 2 and 3 are simplified top-down views of other types of cellular switches. The cells may be stripes, hexagons, rectangular, etc. There may be hundreds of substantially identical cells connected in parallel.

FIG. 2 shows a lateral MOSFET switch, where all sources 14 are connected in parallel, all drains 16 are connected in parallel, and all gates 18 are connected in parallel. The three electrodes are on the top of the die.

FIG. 3 shows a vertical MOSFET switch, where all sources 20 are connected in parallel, all gates 22 are connected in parallel, and a single drain is a bottom substrate. The drain electrode is on the bottom, and the source and gate electrodes are on top.

One application for insulated-gate power devices is in switching power conversion circuits, where the insulated-gate power devices are switched between off and fully on at a high frequency, such as 40 KHz-5 MHz. The duty cycle of the switch is controlled using feedback to achieve a target voltage or current at the output of the conversion circuit. The switch's current waveform is smoothed using a low pass filter, such as formed using capacitors and inductors. While a number of power conversion techniques exist, they typically include a driver circuit for driving one or more semiconductor switches. All cells are connected in parallel and switched together. The power conversion efficiency of a circuit is determined primarily by three sources of loss:

1. Conduction losses (while the device is fully on): I×R;
2. Transition losses: Switching losses (ETS) in semiconductor; and
3. Gate charge switching losses.

Generally, transition losses and gate charge losses over a time period increase with switching frequency, and together we will refer to them as switching losses.

All power conversion circuits have an efficiency that is determined by the load current at a given time. At light load currents, switching losses dominate, while at high load currents, conduction losses dominate. Peak conversion efficiency occurs at a load current that is between the light load condition and the high load condition.

What is needed is a design technique for various types of semiconductor switches that reduces (and ideally minimizes) losses for particular load currents.

SUMMARY

A conventional semiconductor switch used for power applications, such as in a switching power supply, contains many small cells connected in parallel. A single driver circuit thus controls all cells to conduct in substantially the same way and conduct the same current. This gives rise to the different dominant causes of loss at different load currents, as discussed above.

One approach for reducing such losses is to divide up the cells into segments. Each segment may include a plurality of cells. There may be hundreds of cells in an actual semiconductor switch. Let's assume that the cells have been divided into seven equal segments, where each segment has their gates connected together and coupled to a separate driver circuit. Therefore, there are seven driver circuits.

Depending on the actual load current to be switched, the optimal combination of segments will be activated. If the load current is low, to limit switching losses, only one or two segments will be actively switched for the power conversion. Although the conduction loss will slightly increase, the switching losses will be reduced by as much as 85% (i.e., one-seventh of the loss compared to if the entire switch were being actively switched).

At medium load currents, perhaps 3-5 of the segments would be switched, and the remaining segments would remain off. This presents a good compromise between conduction losses and switching losses.

At high load currents, all segments may be switched to minimize conduction losses.

In the cases where not all the segments are activated, the sum of conduction losses plus switching losses will be reduced. The particular combination of segments activated for a particular load current may be set using a look-up table or a simple logic device.

Since each of the seven drivers is independently controlled, the drivers may present different drive signals to the gates, such as progressively delayed signals, to reduce switching transients.

One issue with the above technique is that the added number of drivers increases losses due to the drivers. To reduce the number of drivers, the segment areas may be binary weighted and then selectively combined to achieve the desired number of switching cells. For example, there may be three segments, where a first segment has an area of cells of 1×. A second segment may have an area of cells of 2×, and a third segment may have an area of cells of 4×. Therefore, there are six possible combinations of numbers of cells that are switched for optimizing switching losses and conduction losses.

The weighted segment approach is generally equivalent to providing seven equal segments and connecting the gates of some segments together to result in three different areas, each controlled by a separate driver.

When driving segments with different effective gate areas, the slew rates will be different for each segment if driven by identical drive signals due to the different gate capacitances. If it is desired to have all segments transition to fully on at the same rate, the drivers for each segment are customized to cause each segment to have the same slew rate. This result may be accomplished by adding resistances between the drivers and gates or designing the drivers to have different transistor sizes (larger transistors for a higher slew rate).

Although this technique may add some area for extra gate pads, the gate current and voltage is relatively small, so the gate pads can be small.

The sources of all the segments may be connected together at a common source electrode, and the drains of all the segments may be connected together at a common drain electrode.

In another embodiment, for very high currents, multiple switch chips (dies) can be used, and different combinations of chips connected in parallel can be used to form the different segment sizes.

Although seven segments are discussed above, the number of segments can be larger or smaller. The optimized control of the various segments can be determined by testing and/or simulation.

This approach works with most types of cellular, insulated-gate switches, whether vertical or lateral switches.

In a majority carrier device such as a MOSFET, the relative sizes of all of the segments may have integer ratios, since the current injected by each segment is directly proportional to the amount of injecting source perimeter. However, in minority carrier devices such as IGTOs, IGBTs, and MCTs, the current through equally sized segments will not be directly proportional to the amount of injecting source perimeter. Minority carrier devices have non-equilibrium quantities of carriers present during both normal conduction and transient conditions that affect the current density. The ratio of the areas of the segments can be adjusted to partially compensate for this behavior, but there is still a difference in current density that is a function of the magnitude of the current. Another approach is to use a heavily doped region, a region with reduced carrier lifetime, or a dielectric-filled trench to reduce or prevent unwanted segment-to-segment carrier flow.

The driver circuits may be on the same chip as the switch or may be on separate chips.

Other embodiments are disclosed.

BRIEF DESCRIPTION OF THE DRAWINGS

Elements that are the same or equivalent in the various figures may be labeled with the same numeral.

DETAILED DESCRIPTION

Disclosed herein are various embodiments of a segmented high current/high voltage switch that may be used in a switching power supply, where switching losses occur upon each transition of the switch. Further losses occur due to conduction losses when the switch is fully turned on. The invention may also be useful in other applications requiring frequent switching. An insulated gate switch is assumed, since there are significant gate charge losses during each switching cycle, but other types of switches can benefit from the invention.

Figure 4:
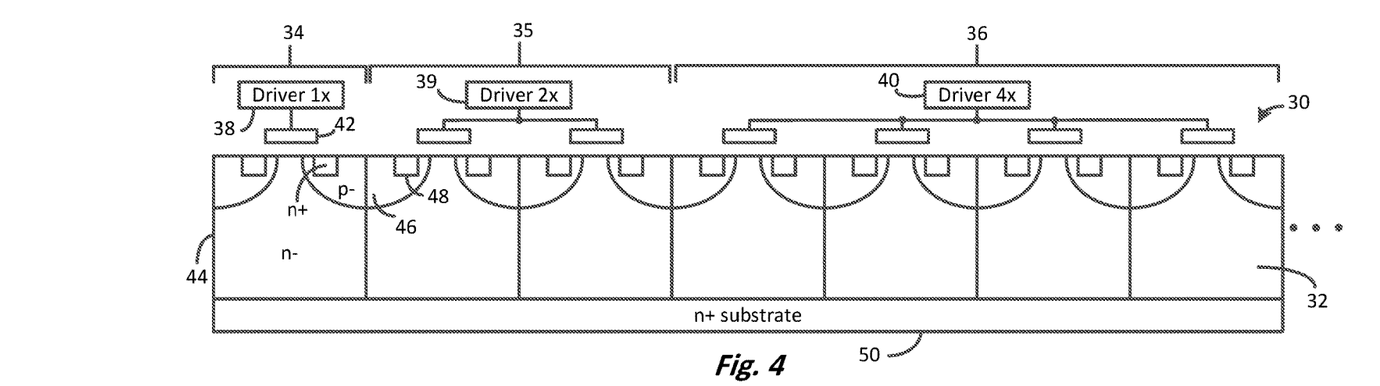
FIG. 4 is a simplified cross-section of a vertical MOSFET, in accordance with one embodiment of the invention, where three segments are shown having different numbers of cells to form a binary weighted cell distribution. Each segment is separately controlled by a driver.

The invention applies to any type of switch and, in FIG. 4, a vertical MOSFET 30 is used as an example.

FIG. 4 is a simplified cross-section of a vertical MOSFET 30 having many cells, such as hundreds of cells. Each cell is substantially identical and carries the same current (when active). The cells may be in parallel strips, hexagonal, rectangular, etc. Only seven cells 32 are shown in FIG. 4 for simplicity.

In FIG. 4, the cells 32 are divided into three segments 34, 35, and 36, where the cells 32 in each segment are connected in parallel. In an actual embodiment, there may be ten or more cells in each segment. The three segments 34-36 are shown having different numbers of cells 32 to form a binary weighted cell distribution. Each segment 34-36 is separately controlled by a gate driver 38, 39, and 40.

Each cell 32 includes an insulated gate 42, a common n− drift layer 44, p-wells 46 (or p− bodies), and n+ sources 48. An n+ substrate 50 forms the drain of the vertical MOSFET 30.

When a particular gate 42 is biased positive above a threshold voltage (Vth), and the sources 48 and drain (n+ substrate 50) are positively biased, the cells 32 in the particular segment 34-36 are all turned on and conduct the same current. Since the segment 36 has four times as many cells 32 as the segment 34, it conducts four times the current.

The drivers 38-40 may be designed to drive their associated gates 42 with different currents to equalize the slew rates for each segment 34-36, or the drivers 38-40 may be designed to intentionally cause the cells 32 in each segment 34-36 to not slew at the same rate, such as in order to reduce transients.

The selection of the number of cells 32 in each segment 34-36 and the number of segments 34-36 depends on the number of different configurations desired.

The combination of segments 34-36 that is switched for a particular load is selected based on the particular anticipated or actual load current and the lowest overall losses achievable. For example, for a very high current load, all the segments 34-36 may need to be active to supply the required current to the load. For very light load currents, the smallest segment 34 may be the only one active to minimize switching losses, while the conduction loss will be very low due to the low load current. For medium load currents, there is a tradeoff between conduction losses and switching losses since the conduction losses are reduced with more segments being active but the switching losses increase. The optimal combination of segments 34-36 (active drivers 38-40) depends on the particular design of the switch. The switch may be programmed, or a separate controller chip may be programmed, with signals corresponding to the anticipated load current, or the load current may be measured during a brief portion of operation of the switch, to determine the optimal combination of segments 34-36 to activate to minimize losses.

There are seven different combinations of segments 34-36 that may be used in FIG. 4 to achieve the lowest losses, due to the combination of conduction losses and switching losses. For very high switching rates, such as greater than 100 KHz, switching losses may be particularly high, so activating fewer segments 34-36 may be desirable at the expense of conduction losses.

In an alternative embodiment, there may be equal size segments, such as 20 cells each, with seven independently controlled drivers. The combinations of segments will then be determined to result in the lowest overall loss (conduction loss+switching loss). In the example of seven equal segments, there will be seven different combinations. However, the seven drivers also incur losses. Since there are fewer losses using the binary weighted segments in FIG. 4, the binary weighted embodiment is more efficient.

The same technique can be used with the insulated-gate power devices of FIGS. 1-3, an IGBT, or any other cellular switch that can be divided into segments.

Figure 5:
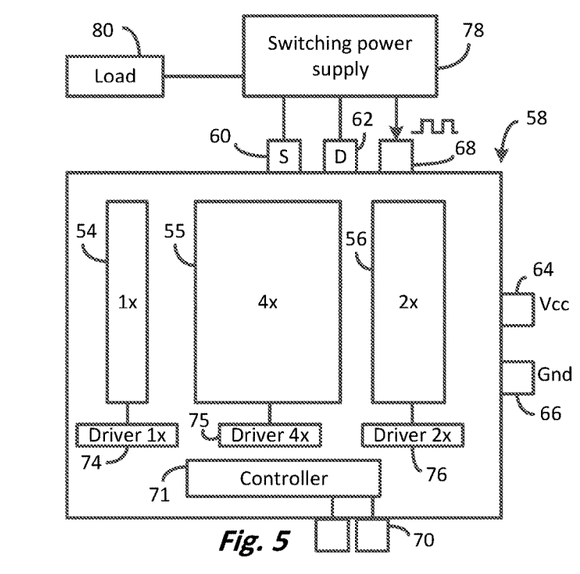
FIG. 5 is a top down view of one possible configuration of segments, where the largest segment (highest current) is in the middle where heat spreading is the best.

FIG. 5 is a top down view of one possible configuration of binary weighted segments 54, 55, and 56, in an insulated gate switch 58, where the largest segment 55 (highest current) is in the middle where heat spreading is the best.

The chip may include source and drain terminals 60 and 62, Vcc and ground terminals 64 and 66, an on/off control terminal 68, and programming terminals 70 for selecting the combination of segments 54-56 for a particular load current (assuming a certain switching frequency for a switching power supply). A controller 71 receives the programming signals and controls the drivers 74-76 accordingly. The various components may be on separate chips.

Similarly, the segments 54-56 may be on separate chips if the power required is larger than a single chip can supply. For example, the chip of FIG. 5 may be one of a number of chips effectively forming a single power switch by connecting their sources and drains in parallel.

FIG. 5 can include guard rings that surround all of the segments to make sure that the breakdown (or breakover) voltage is uniform across the device. This behavior may be further enhanced by introducing deeper p-type regions in each segment that control localized breakdown (or breakover).

A conventional switching power supply 78 is also shown connected to a load 80. The power supply 78 contains feedback, smoothing, and control circuitry for controlling when the switch 58 turns on and off.

When driving different size gate areas, the slew rate for each gate area will be different if identical drive circuits are used for each gate area. This condition will result in different amounts of overshoot during switching. This behavior may be avoided by including on-chip resistors having different, selected values for each gate area. Another approach is to use a gate drive circuit that provides the desired gate slew rate for the gate area of each segment. Such a gate drive circuit may be analog or digital (which could include the use of a state machine) and may, in conjunction with the power switch chip, include sense capability for:
1. Temperature;
2. Current;
3. Voltage;
4. Gate slew rate; and
5. Other parameters.

Figure 6:
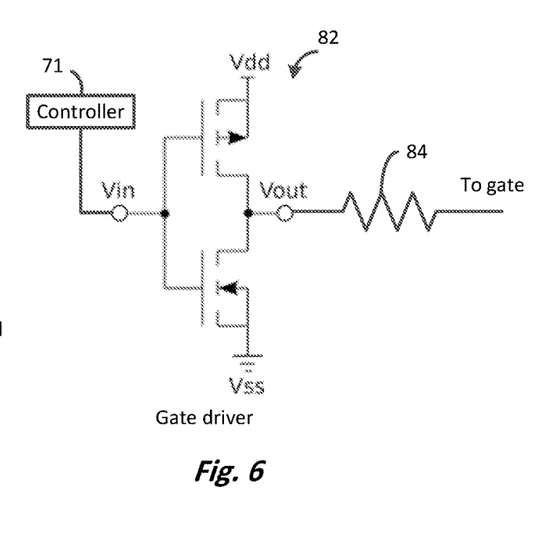
FIG. 6 illustrates a simplified CMOS driver for each segment, where the driver may be customized for each segment to achieve the desired slew rate.

FIG. 6 illustrates a simplified CMOS driver 82 for each segment 54-56, where the driver 82 may be customized for each segment 54-56 to achieve the desired slew rate. Since the segments 54-56 have different effective gate areas, the driver for the largest segment may supply a larger current to charge the gates at the same rate as the driver for the smallest segment. So, slew rates may be adjusted by selecting different sizes of driver transistors or connecting drivers in parallel, or by providing a selected resistance 84 between a driver and its gates.

Figure 7:
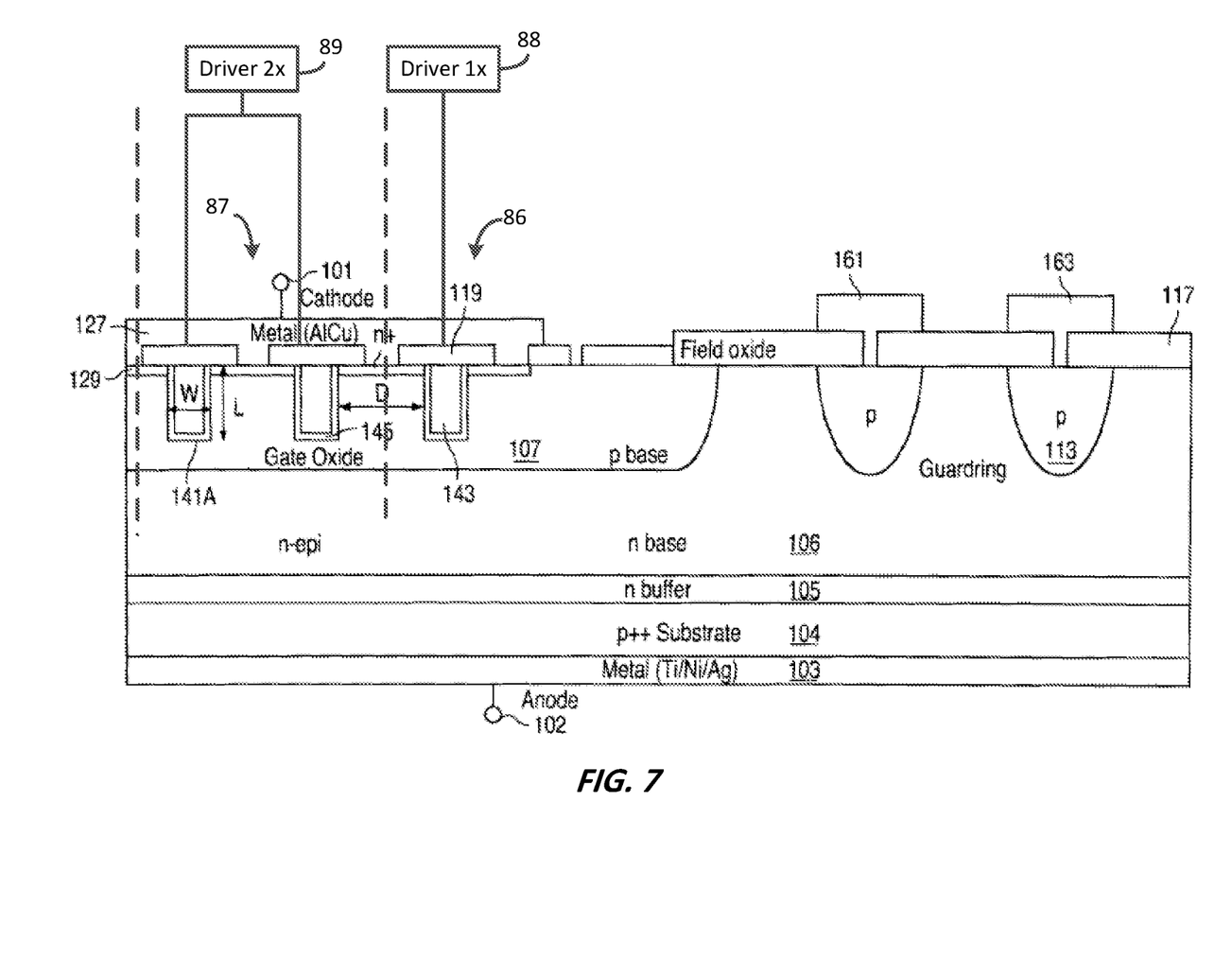
FIG. 7 is FIG. 1 but showing how the cells can be divided into separately controllable binary weighted segments to achieve lower losses. Only two segments are shown.

FIG. 7 is FIG. 1 but showing how the cells can be divided into separately controllable binary weighted segments 86 and 87, with associated drivers 88 and 89, to achieve lower losses (conduction loss+switching loss). Only two segments are shown, but there may be three or more segments, each containing over ten cells.

Figure 8:
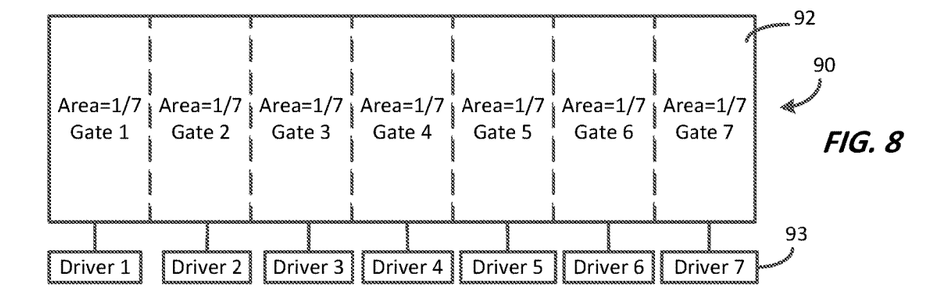
FIG. 8 illustrates how each segment can have the same area (same number of cells), where any combination of segments can be controlled to optimize losses, reduce heat, and reduce transients by using different slew rates.

FIG. 8 shows a portion of a cellular switch 90, illustrating how each segment 92 can have the same area (same number of cells), where any combination of segments 92 can be controlled by activating selected drivers 93 to optimize losses, reduce heat, and reduce transients by using different slew rates. Any segment that is not activated by a driver draws no current and incurs no losses.

Figure 9:
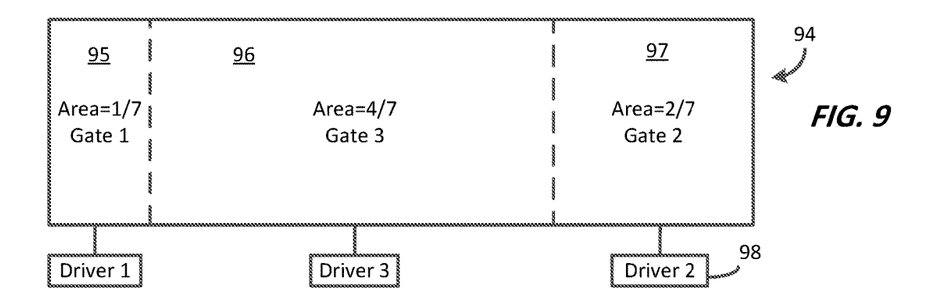
FIG. 9 illustrates how each segment can have different areas (different numbers of cells) to create binary weighted segments, where any combination of segments can be controlled to optimize losses, reduce heat, and reduce transients by using different slew rates.

FIG. 9 shows a portion of a cellular switch 94, illustrating how each segment 95-97 can have different areas (different numbers of cells) to create binary weighted segments, where any combination of segments 95-97 can be controlled by activating selected drivers 98 to optimize losses, reduce heat, and reduce transients by using different slew rates.

Figure 10:
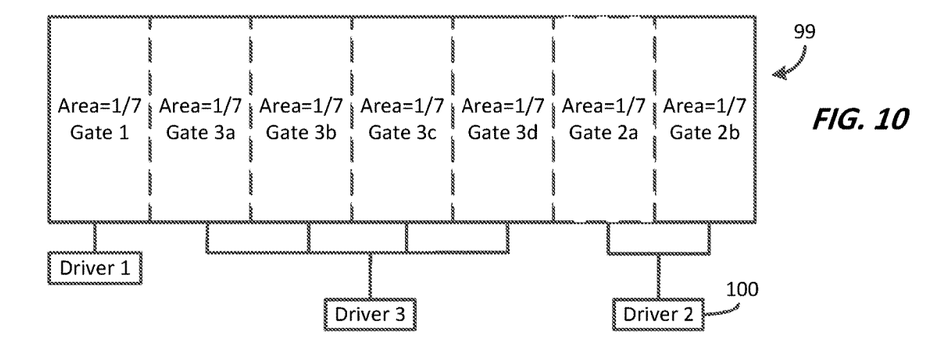
FIG. 10 illustrates how the cells are divided into seven equal areas, but the gates in various areas are connected together to form three different size segments, where any combination of segments can be controlled to optimize losses, reduce heat, and reduce transients by using different slew rates.

FIG. 10 shows a portion of a cellular switch 99, illustrating how the cells are divided into seven equal areas, but the gates 1-3d in each of three areas are connected together to the same driver (e.g., driver 100) to effectively form three different size segments, where any combination of segments can be controlled to optimize losses, reduce heat, and reduce transients by using different slew rates.

In addition, if specific dynamic current ratios are desired, different segments may be driven to conduct during different times of a changing signal.

Figure 11:
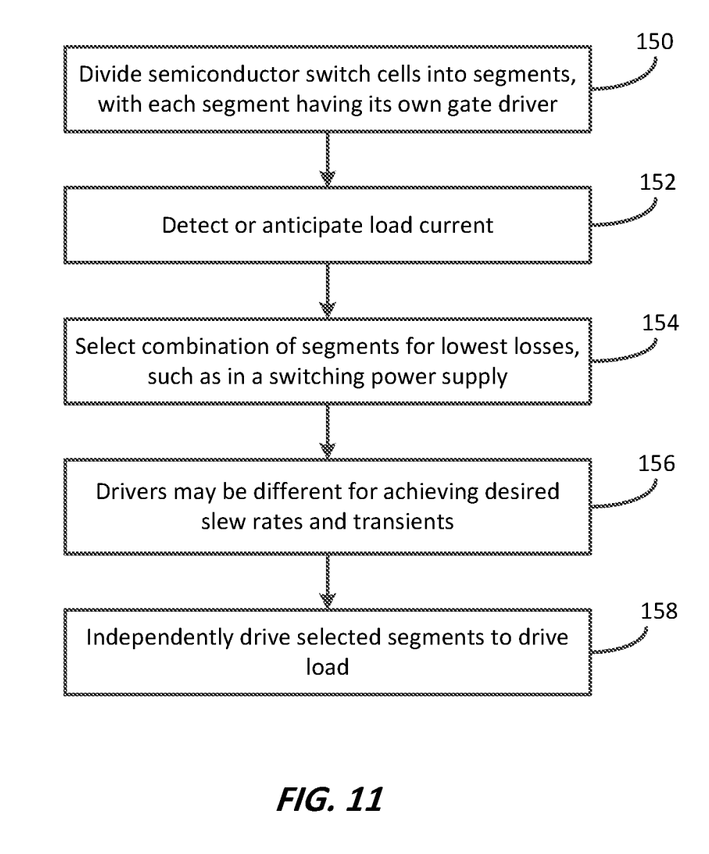
FIG. 11 is a flowchart illustrating various steps used to carry out one embodiment of the invention.

FIG. 11 is a flowchart illustrating various steps used to carry out one embodiment of the invention.

In step 150, the cells in an insulated gate switch are divided into segments, with each segment having its own driver that is activated by a programmed controller.

In step 152, the actual load current or an anticipated load current is identified. An external signal may provide programming signals for the switch's controller that activates selected drivers for the segments. In one embodiment, the switch is fully turned on for a moment to detect the actual current to the load in a switching power supply, and this information is then used by a look-up table (or other logic) to select the optimal combination of segments for subsequent switching (step 154). As the load changes during operation of the switching power supply, the combination of segments may also change to minimize the losses. Alternatively, a programming signal that identifies the approximate load current may be used.

In steps 156 and 158, the selected drivers are activated, and the drivers may be designed to customize slew rates to achieve various effects, such a low transients.

Slew rate is expressed as $dVg/dt=I/Cg$. The gate time constant is expressed as $R*Cg$, where R is the resistance related to the resistance between the gate pad and the gates. The gate current is expressed as $f*Qg$, where f is the switching frequency. These equations may be used to determine the optimal segment selection. Such optimization and equations would be understood by those skilled in the art.

Various features disclosed may be combined to achieve a desired result.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate switch system comprising:
   a power switch formed on a single semiconductor die, the power switch being composed of a plurality of cells;
   the plurality of cells on the die being grouped into segments, where the cells in each segment are connected in parallel, wherein the segments have different numbers of cells in them;
   a plurality of controllable driver circuits, each driver circuit being connected to an associated segment to supply charge to gates of cells in the associated segment to cause the associated segment to conduct a current to a load,
   wherein each driver is designed to control conduction of its associated segment such that a slew rate from off to on, or from on to off, for each segment is substantially the same, wherein a first driver associated with a first segment having fewer cells than a second segment outputs a first drive signal with a first current lower than a second drive signal of a second driver associated with the second segment such that slew rates of the first segment and the second segment are substantially the same; and
   a controller configured to control the plurality of driver circuits, where a different combination of segments is selected based on a load current to be driven by the power switch to control conduction and switching losses by the power switch, wherein the driver circuits that are selected to control the conduction of the segments all provide drive signals simultaneously so that the selected segments are switched on and off at substantially the same time.

2. The system of claim 1 wherein the number of cells in the segments are binary weighted.

3. The system of claim 1 wherein the power switch comprises an insulated gate device.

4. The system of claim 1 wherein the power switch comprises a MOSFET.

5. The system of claim 1 wherein there are at least three segments.

6. The system of claim 1 further comprising a switching power supply controller coupled to the power switch to turn the power switch on and off at a certain frequency.

7. The system of claim 1 wherein the combination of segments is selected to reduce combined conduction losses and switching losses by the power switch.

8. The system of claim 1 wherein the controller is programmable, wherein the programming is based on an anticipated load current or an actual load current.

9. The system of claim 1 wherein the power switch is a first power switch, the system further comprising a second power switch, formed on a different semiconductor die, connected in parallel with the first power switch.

10. The system of claim 1 wherein each driver is designed to control conduction of its associated segment such that a slew rate from off to on for each segment is substantially the same.

11. A method of controlling a power switch comprising:
providing a power switch comprised of a semiconductor die having a plurality of cells grouped into segments, where the cells on the die in each segment are connected in parallel, and wherein the segments have different numbers of cells in them;
selectively controlling a plurality of driver circuits, each driver circuit being connected to an associated segment,
wherein each driver is designed to control conduction of its associated segment such that a slew rate from off to on, or from on to off, for each segment is substantially the same, wherein a first driver associated with a first segment having fewer cells than a second segment outputs a first drive signal with a first current lower than a second drive signal of a second driver associated with the second segment such that slew rates of the first segment and the second segment are substantially the same; and
wherein selectively controlling the plurality of drivers comprises:
supplying charge to gates of cells in the associated segments to cause the associated segments to conduct a current to a load, where a different combination of segments is selected based on a load current to be driven by the power switch to control conduction and switching losses by the power switch wherein the driver circuits that are selected to control the conduction of the segments all provide drive signals simultaneously so that the selected segments are switched on and off at substantially the same time.

12. The method of claim 11 wherein a signal corresponding to the load current is used to program a controller that controls the driver circuits.

13. The method of claim 11 wherein the number of cells in the segments is binary weighted.

14. The method of claim 11 wherein the power switch is connected in a switching power supply.

15. The method of claim 11 wherein each driver is designed to control conduction of its associated segment such that a slew rate from off to on for each segment is substantially the same.

* * * * *